United States Patent [19]
Park

[11] Patent Number: 5,891,749
[45] Date of Patent: Apr. 6, 1999

[54] PROCESS FOR FORMING PHOTORESIST PATTERN IN SEMICONDUCTOR DEVICE

[75] Inventor: Ki-Yeop Park, Seoul, Rep. of Korea

[73] Assignee: Hyundai Electronics Industries Co., Ltd., Kyoungki-do, Rep. of Korea

[21] Appl. No.: 774,182

[22] Filed: Dec. 26, 1996

[30]  Foreign Application Priority Data

Dec. 29, 1995 [KR] Rep. of Korea ........................ 95-66056

[51] Int. Cl.⁶ ...................................................... H01L 21/18
[52] U.S. Cl. ........................ 438/38; 430/270.1; 430/197; 438/974; 438/976; 438/694
[58] Field of Search ................................. 430/270.1, 197; 438/974, 976, 694, 38, 270.1, 197

[56]  References Cited

U.S. PATENT DOCUMENTS 4,882,260  11/1989  Kohara et al. .......................... 430/191
5,332,648  7/1994  Kihara et al. ........................... 430/270

OTHER PUBLICATIONS

CA:122:44316 Abs of JP06275504, 1994.
Silicon Processing vol. 1 Lattice Press. Chapter 4 "Basics of thin film processing" pp. 109–110, 1986.

*Primary Examiner*—Gary Geist
*Assistant Examiner*—Jean F. Vollano
*Attorney, Agent, or Firm*—Ware, Fressola, Van Der Sluys & Adolphson LLP

[57] ABSTRACT

The present invention discloses a process for forming a photoresist pattern in a semiconductor device. In this process, first, a semiconductor substrate where an objective layer for the formation of a pattern is formed thereon, is provided. Afterwards, an alkaline aqueous solution is formed on the semiconductor substrate using either spray, coating, or deposition method. Thereafter, a priming step is performed. Lastly, a photoresist pattern is formed on the semiconductor substrate.

9 Claims, 4 Drawing Sheets

PROCESS FOR FORMING PHOTORESIST PATTERN IN SEMICONDUCTOR DEVICE

BACKGROUND OF THE INVENTION

1. Field of the Invention

This invention generally relates to a process of forming a pattern for formation of a semiconductor device, more particularly to a process for forming a photoresist pattern used in forming a pattern of a layer in a semiconductor device.

2. Description of the Related Art

As a semiconductor device is highly integrated, high miniature and precision of critical dimension are essentially required. As a result, the conventional lithography system is met with limitations in enhancing performance.

A general process of forming a photoresist pattern used in forming a pattern of a layer in a semiconductor device, a photolithography process is described referring to enclosed drawing.

FIG. 1A–1B are cross-sectional views illustrating a process of forming a photoresist pattern according to a conventional method.

Referring to FIG. 1A, in order that a photoresist film 2 is to be coated well on a silicon substrate 1, a prime step is first performed to the surface of the silicon substrate 1. The prime step is a process to make a photoresist film attached strongly on the substrate 1, where the silicon substrate 1 is processed by a chemical etchant and is baked at a selected temperature during the prime step. Thereafter, the photoresist film is coated on the silicon substrate 1.

Referring to FIG. 1B, a predetermined portion of the coated photoresist film 2 is selectively exposed to light, and then the exposed portion is removed by a developing solution, thereby exposing the selected portion of the silicon substrate 1.

FIG. 2 and FIG. 3 show photoresist patterns formed according to the above-mentioned conventional method. FIG. 2 is a plane view showing a photoresist pattern for a space pattern such as a contact hole and FIG. 3 is a cross-sectional view taken along 3—3 line in FIG. 2. Symbol 5 is the outline of the space.

Referring to FIG. 2 and FIG. 3, at an edge portion of an exposed surface of the silicon substrate 1, there is a small amount of residue such as scum 3 and tail 4 from the developed photoresist film 2. The residue 3 and 4 is related with difference in the adhesion force between the silicon substrate 1 and the photoresist film 2.

In order to pattern a layer formed on a wafer, lithography process is performed on the layer. The lithography process is performed at an order of dehydration, photoresist spin coating, pre-bake, exposure, post exposure bake, developement, and inspection steps.

FIG. 4 shows a silicon substrate on which a layer for the patterning is formed when the dehydration step has been completed.

Referring to FIG. 4, the surface of the silicon substrate 1 is covered with a hydrophobic action radical "R".

Return to FIGS. 2 and 3, the hydrophobic action radical R increases the adhesion force between the surface of the silicon substrate 1 and the photoresist film 2 so that, after the developing step is performed to expose a selected portion of the silicon substrate 1 using a chemical solution, a small amount of residue of the photoresist film 2 exists around the outline 5 of the space.

In addition, the residue cause the generation of defects such as a tail and scum phonemena, which contributes to a decrease in product yield.

The defects negatively influences on measuring a pattern size in a semiconductor device, thereby decreasing the reliability of the semiconductor device.

The pattern size is measured at the contact interface 5 between the silicon substrate 1 and photoresist pattern 2 by an apparatus such as scanning electron microscope(SEM), and the measurement is performed by scanning an electron beam to the photoresist pattern 2 and the substrate 1. However, the defect of scum or exists on the exposed silicon substrate 1 and the contact interface 5, it becomes very difficult to measure the pattern size. In addition, though the measured value is attained, there is a degree of error.

SUMMARY OF THE INVENTION

Accordingly, it is an object of the present invention to provide a method for forming a photoresist pattern of a semiconductor device capable of preventing an unnecessary material such as scum or tail from remaining at the contact interface between a semiconductor substrate and photoresist film in the process of forming a photoresist pattern by treating a silicon substrate in an alkaline aqueous solution to decrease the adhesion force between the silicon substrate and photoresist film.

It is another object of the present invention to provide a method for forming a photoresist pattern of a semiconductor device capable of enhancing the performance and reliability in a semiconductor device by preventing an unnecessary material from being generated by using an alkaline aqueous solution.

According to the present invention, first, a semiconductor substrate where an objective layer for the formation of a pattern is formed thereon, is provided. Afterwards, an alkaline aqueous solution film is formed on the semiconductor substrate using either spray, coating, or deposition method. Lastly, a photoresist pattern is formed on the semiconductor substrate.

BRIEF DESCRIPTION OF THE DRAWINGS

Further objects and advantages of the present invention will be apparent from the following description, reference being had to the accompanying drawings wherein preferred embodiment of the present invention are clearly shown.

In the drawings.

DETAILED DESCRIPTION OF THE INVENTION

Hereinbelow, the preferred embodiments are described in detail, referring to the enclosed drawings.

Figure 1A:
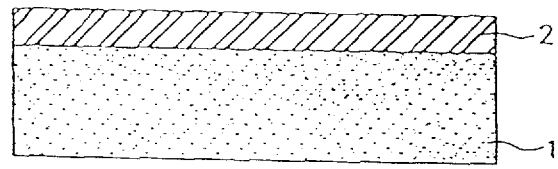
FIG. 1A–1B are cross-sectional views illustrating a process of forming a photoresist pattern according to a conventional method.
Figure 1B:
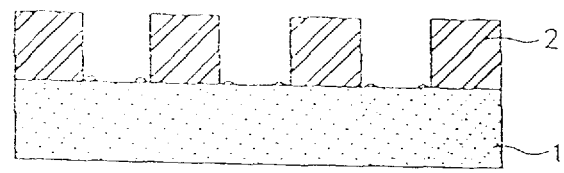
Figure 2:
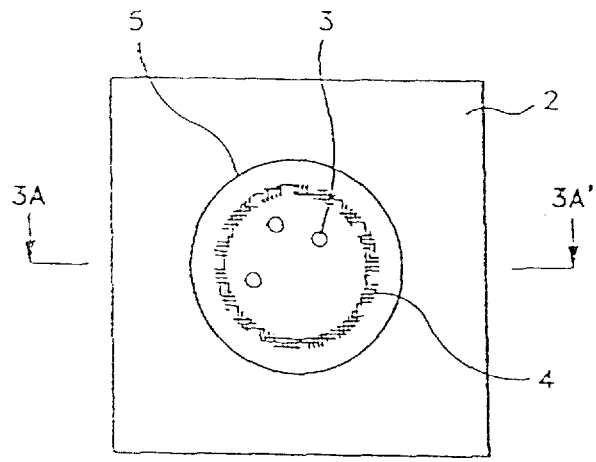
FIG. 2 is a plane view of a photoresist patterns formed on a silicon substrate according to the conventional method.
Figure 3:
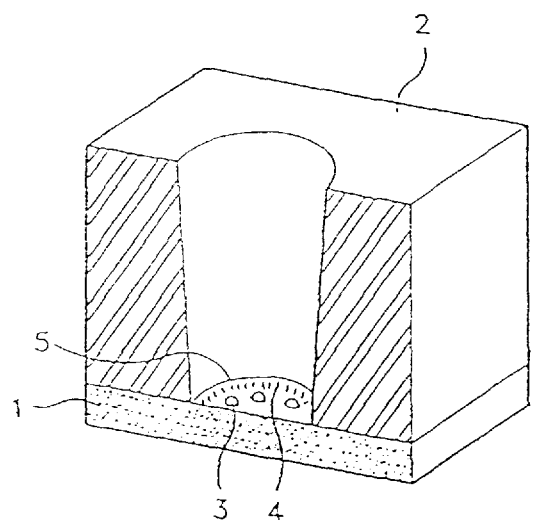
FIG. 3 is a perspective view taken along 3—3 line in FIG. 2.
Figure 4:
FIG. 4 is a schematic diagram of a silicon substrate before the substrate is processed in an alkaline aqueous solution.
Figure 5A:
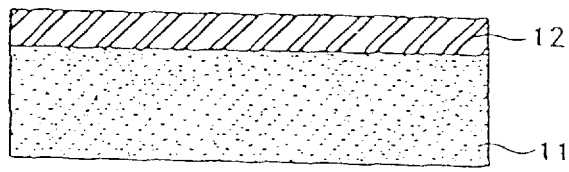
FIGS. 5A to 5C are simplified cross-sectional views illustrating a process of forming a photoresist pattern according to one embodiment of the present invention.
Figure 5B:
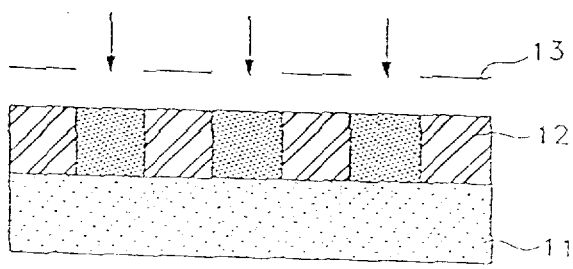
Figure 5C:
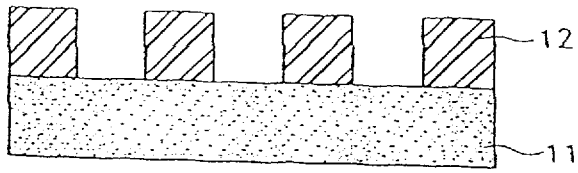

FIGS. 5A to 5C are simplified cross-sectional views illustrating a process of forming a photoresist pattern according to one embodiment of the present invention.

Referring to FIG. 5A, a silicon substrate 11 is processed in an alkaline aqueous solution, to control an adhesion force between its surface and a photoresist film 12 to be subsequently formed on the silicon substrate 11, where the silicon substrate 11 includes all substrates containing silicon component. The process in the alkaline aqueous solution is one for contacting the silicon substrate 11 with a material of any physical state discharging a functional —OH group in aqueous solution or diluent of the material, at a temperature range of 20°–30° C., and time period of 30–100 seconds. In carrying out the process with an alkaline aqueous solution, the alkaline aqueous solution is either sprayed, coated, or deposited on the silicon substrate 11.

Figure 6:
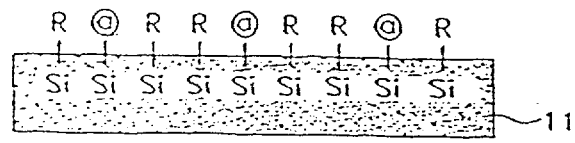
FIG. 6 is a schematic diagram of a silicon substrate after the substrate is processed in an alkaline aqueous solution.

FIG. 6 is a schematic diagram of a silicon substrate after the substrate is processed in an alkaline aqueous solution.

Referring to FIG. 6, a portion of a hydrophobic functional group R is substituted with an alkaline functional group. Generally, alkaline functional group decreases adhesion force between the silicon substrate 11 and photoresist film 12. Thus, adhesion force between the silicon substrate 11 and photoresist film 12 is controlled by any one in methods of: varying the contact time between alkaline aqueous solution and silicon substrate 11; varying the contact temperature; or varying the concentration of the alkaline aqueous solution. Next, a photoresist film 12 is coated on the substrate 11 and the alkaline aqueous solution formed thereon.

Referring to FIG. 5B, the photoresist film is selectively exposed to a light to form a predetermined shaped pattern using a mask 13.

Referring to FIG. 5C, portions exposed in the photoresist film 12 are removed by a developing step using a chemical solution. At this time, as described above, since the adhesion force between the silicon substrate 11 and photoresist film 12 is weakened by the alkaline aqueous solution, the portions selectively exposed in the photoresist film 12 can be easily removed.

Figure 7:
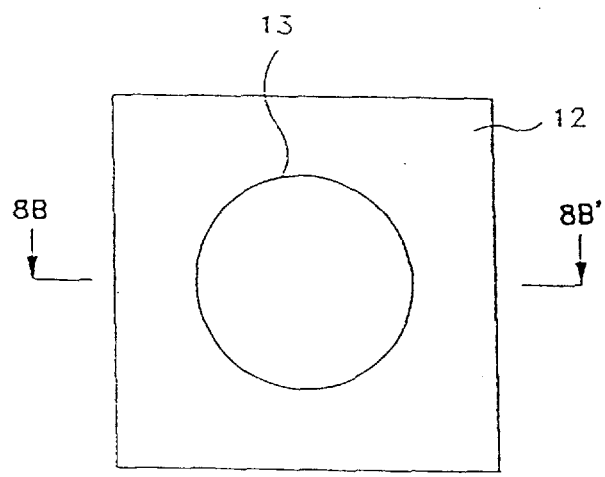
FIG. 7 is a plane view of a photoresist patterns formed on a silicon substrate according to the present invention.
Figure 8:
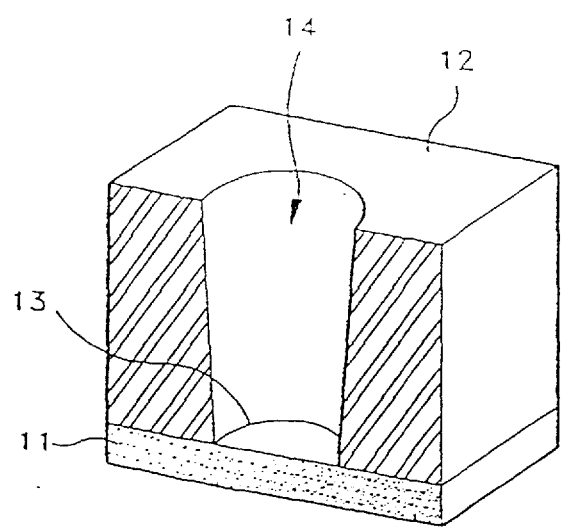
FIG. 8 is a perspective view taken along 8—8 line in FIG. 7.

FIG. 7 is a plane view of a photoresist patterns formed on a silicon substrate according to the present invention and FIG. 8 is a perspective view taken along 8—8 line in FIG. 7.

Referring to FIG. 7 and FIG. 8, since the silicon substrate 11 has been processed in an alkaline aqueous solution before the photoresist film 12 is coated thereon, there does not exist a residue such as scum or tail on an exposed surface of the silicon substrate 11 below a contact hole 13 formed in the photoresist film 12 where the formation of the photoresist pattern has been completed.

As described previously, in the process for forming a photoresist pattern, the present invention prevents an unnecessary material such as scum or tail from remaining at the contact interface between a silicon substrate and photoresist film by treating the silicon substrate in an alkaline aqueous solution to decrease the adhesion force between the silicon substrate and photoresist film. As a result, this invention provides an effect to enhance the reliability and performance in a semiconductor device.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A process for forming a photoresist pattern on a semiconductor substrate for the formation of a semiconductor device comprising the steps of:

providing a semiconductor substrate;

forming an alkaline aqueous solution on the semiconductor substrate; and forming a photoresist pattern on the semiconductor substrate with the alkaline aqueous solution formed thereon, wherein an adhesion force generated between said semiconductor substrate and said photoresist pattern is decreased.

2. The process in accordance with claim 1, wherein the semiconductor substrate contains silicon component.

3. The process in accordance with claim 1, wherein the alkaline aqueous solution forming step is performed using a spraying method.

4. The process in accordance with claim 1, wherein the alkaline aqueous solution forming step is performed using a coating method.

5. The process in accordance with claim 1, wherein the alkaline aqueous solution forming step is performed using a deposition method.

6. The process in accordance with claim 1, wherein the step of forming the alkaline aqueous solution is performed at a temperature range of 20°–30° C., and a time period of 30–100 seconds.

7. The process in accordance with claim 1, wherein the adhesion force is controlled by varying the contact time between the alkaline aqueous solution and semiconductor substrate.

8. The process in accordance with claim 1, wherein the adhesion force is controlled by varying the contact temperature between the alkaline aqueous solution and semiconductor substrate.

9. The process in accordance with claim 1, wherein the adhesion force is controlled by varying the concentration of the alkaline aqueous solution.

\* \* \* \* \*

UNITED STATES PATENT AND TRADEMARK OFFICE
CERTIFICATE OF CORRECTION

PATENT NO.   : 5,891,749
DATED        : April 6, 1999
INVENTOR(S)  : K. Park

It is certified that error appears in the above-identified patent and that said Letters Patent is hereby corrected as shown below:

At col. 3, line 49, please cancel "8—8 line" and substitute therefor --line 8—8--.

Signed and Sealed this

Seventh Day of September, 1999

Attest:

Q. TODD DICKINSON

*Attesting Officer*   *Acting Commissioner of Patents and Trademarks*